(12) United States Patent  
Chu et al.

(10) Patent No.: US 11,804,462 B2
(45) Date of Patent: Oct. 31, 2023

(54) HYBRID BONDING STRUCTURES AND SEMICONDUCTOR DEVICES INCLUDING THE SAME

(71) Applicant: Samsung Electronics Co., Ltd., Suwon-si (KR)

(72) Inventors: Kunmo Chu, Seoul (KR); Junghoon Lee, Seongnam-si (KR); Byonggwon Song, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 17/467,973

(22) Filed: Sep. 7, 2021

(65) Prior Publication Data

US 2022/0077100 A1 Mar. 10, 2022

(30) Foreign Application Priority Data

Sep. 8, 2020 (KR) .................. 10-2020-0114855

(51) Int. Cl.
*H01L 23/00* (2006.01)

(52) U.S. Cl.
CPC .............. *H01L 24/29* (2013.01); *H01L 24/73* (2013.01); *H01L 24/83* (2013.01); *H01L 24/92* (2013.01); *H01L 24/13* (2013.01); *H01L 24/16* (2013.01); *H01L 24/32* (2013.01); *H01L 24/81* (2013.01); *H01L 2224/13111* (2013.01); *H01L 2224/13113* (2013.01); *H01L 2224/13139* (2013.01); *H01L 2224/13147* (2013.01); *H01L 2224/13155* (2013.01); *H01L 2224/16147* (2013.01);

(Continued)

(58) Field of Classification Search
CPC ........... H01L 24/73; H01L 2224/81687; H01L 2224/81688

See application file for complete search history.

(56) References Cited

U.S. PATENT DOCUMENTS 8,920,934 B2 12/2014 Jiang et al.
9,185,812 B2 11/2015 Ueshima
(Continued)

FOREIGN PATENT DOCUMENTS

CN 106695159 A 5/2017
CN 107009045 B 2/2019
(Continued)

OTHER PUBLICATIONS

Zequn Mei et al., "Low-Temperature Solders", Hewlett-Packard Journal, Article 10, Aug. 1996, 10 pages.
(Continued)

*Primary Examiner* — Dale E Page
*Assistant Examiner* — Wilner Jean Baptiste
(74) *Attorney, Agent, or Firm* — Harness, Dickey & Pierce, P.L.C.

(57) ABSTRACT

A hybrid bonding structure and a semiconductor including the hybrid bonding structure are provided. The hybrid bonding structure includes a solder ball and a solder paste bonded to the solder ball. The solder paste may include solder particles including at least one of In, Zn, SnBiAg alloy, or SnBi alloy, and ceramic particles. The solder paste may include a flux. The solder particles may include Sn(42.0 wt %)-Ag(0.4 wt %)-Bi(57.5−X) wt %, and the ceramic particles include $CeO_2(X)$ wt %, where $0.05 \leq X \leq 0.1$.

20 Claims, 13 Drawing Sheets

(52) U.S. Cl.
CPC ............... *H01L 2224/16237* (2013.01); *H01L 2224/29311* (2013.01); *H01L 2224/29313* (2013.01); *H01L 2224/29339* (2013.01); *H01L 2224/29387* (2013.01); *H01L 2224/29409* (2013.01); *H01L 2224/29411* (2013.01); *H01L 2224/29439* (2013.01); *H01L 2224/29444* (2013.01); *H01L 2224/29447* (2013.01); *H01L 2224/29455* (2013.01); *H01L 2224/32057* (2013.01); *H01L 2224/32147* (2013.01); *H01L 2224/32237* (2013.01); *H01L 2224/73203* (2013.01); *H01L 2224/81815* (2013.01); *H01L 2224/83815* (2013.01); *H01L 2224/9211* (2013.01); *H01L 2924/0545* (2013.01); *H01L 2924/1436* (2013.01); *H01L 2924/1443* (2013.01); *H01L 2924/20104* (2013.01); *H01L 2924/20752* (2013.01); *H01L 2924/20753* (2013.01); *H01L 2924/20754* (2013.01)

(56) References Cited

U.S. PATENT DOCUMENTS

| 10,286,498 | B2 | 5/2019 | Sharma et al. |
| 10,675,719 | B2 | 6/2020 | Kawasaki et al. |
| 2007/0278456 | A1* | 12/2007 | Sakai ............... H05K 3/3485 252/512 |
| 2014/0291843 | A1* | 10/2014 | Jiang ............... H01L 23/49816 257/738 |
| 2018/0233424 | A1* | 8/2018 | Sung ............... H01L 24/73 |

FOREIGN PATENT DOCUMENTS

| JP | 5754794 B2 | 7/2015 |
| JP | 5811307 B2 | 11/2015 |
| JP | 6106154 B2 | 3/2017 |
| JP | 6607006 B2 | 11/2019 |
| KR | 10-2016-0021648 A | 2/2016 |
| KR | 10-2019-0034008 A | 4/2019 |
| KR | 10-2019-0103760 A | 9/2019 |

OTHER PUBLICATIONS

Jungsoo Kim et al., "Electromigration behaviors of Sn58%Bi solder containing Ag-coated MWCNTs with OSP surface finished PCB", Journal of Alloys and Compounds, 775, pp. 581-588, 2019.

* cited by examiner

HYBRID BONDING STRUCTURES AND SEMICONDUCTOR DEVICES INCLUDING THE SAME

CROSS-REFERENCE TO RELATED APPLICATION

This application is based on and claims priority under 35 U.S.C. § 119 to Korean Patent Application No. 10-2020-0114855, filed on Sep. 8, 2020, in the Korean Intellectual Property Office, the disclosure of which is incorporated by reference herein in its entirety.

BACKGROUND

1. Field

The present disclosure relates to hybrid bonding structures configured to bond at a low temperature and semiconductor devices including one or more of such hybrid bonding structures, and methods of making same.

2. Description of the Related Art

In semiconductor packaging, methods of bonding elements to each other by using metal alloys having various melting temperatures are used. One of these bonding methods is soldering. An SAC-based solder composed of an alloy of metal materials such as tin (Sn), silver (Ag), and copper (Cu) is a representative example of a material commonly used for soldering.

The melting point of the SAC-based solder is in the range of about 200° C. to about 230° C., and thus, when the SAC-based solder is applied to a highly integrated and thin semiconductor package, a substrate thereof may be bent or stretched depending on a process temperature range. In this case, damage to a solder bonding portion occurs as forces in opposite directions, such as tensile stress and compressive stress, are applied to the top and bottom of the substrate.

SUMMARY

Provided are hybrid bonding structures configured to bond at low temperatures.

Provided are semiconductor devices including hybrid bonding structures configured to bond at low temperatures.

Additional aspects will be set forth in part in the description which follows and, in part, will be apparent from the description, or may be learned by practice of the presented example embodiments of the disclosure.

According to some example embodiments, a hybrid bonding structure may include a solder ball and a solder paste bonded to the solder ball. The solder paste may include solder particles, the solder particles including at least one of In, Zn, SnBiAg alloy, or SnBi alloy, a flux, and ceramic particles. A boundary area between the solder ball and the solder paste may have a modulus of elasticity in a range of about 42.0 GPa to about 45.0 GPa.

The ceramic particles may include at least one of $La_2O_3$, $CeO_2$, SiC, $ZrO_2$, $TiO_2$, $Y_2O_3$, or AlN.

The solder particles may include Sn(42.0 wt %)-Ag(0.4 wt %)-Bi(57.5−X) wt %, and the ceramic particles include $CeO_2$(X) wt %, where $0.05 \leq X \leq 0.1$.

The ceramic particles may be included in an amount of about 0.05 wt % to about 0.1 wt % of a total mass of the solder paste.

The hybrid bonding structure may have a Poisson's ratio in a range of about 0.31 to about 0.35.

The hybrid bonding structure may have a coefficient of thermal expansion in a range of about 14 μm/(m·K) to about 40 μm/(m·K).

The ceramic particles may include one or more surfaces having etched irregularities thereof.

The ceramic particles may each include a metal thin film configured to form an intermetallic compound on one or more surfaces of the ceramic particles.

The metal thin film may include at least one of Au, Ag, Sn, In, Cu, or Ni.

The solder ball may include at least one of Sn—Ag—Cu alloy, Sn—Bi alloy, Sn—Bi—Ag alloy, or Sn—Ag—Cu—Ni alloy.

According to some example embodiments, a semiconductor device may include a printed circuit board, a semiconductor chip, and a hybrid bonding structure between the printed circuit board and the semiconductor chip. The hybrid bonding structure may include a solder ball and a solder paste bonded to the solder ball. The solder paste may include solder particles, the solder particles including at least one of In, Zn, SnBiAg alloy, or SnBi alloy, a flux, and ceramic particles. A boundary area between the solder ball and the solder paste may have a modulus of elasticity in a range of about 42.0 GPa to about 45.0 GPa.

The ceramic particles may include at least one of $La_2O_3$, $CeO_2$, SiC, $ZrO_2$, $TiO_2$, $Y_2O_3$, or AlN.

The solder particles may include Sn(42.0 wt %)-Ag(0.4 wt %)-Bi(57.5−X) wt %, and the ceramic particles include $CeO_2$(X) wt %, where $0.05 \leq X \leq 0.1$.

The ceramic particles may include about 0.05 wt % to about 0.1 wt % of a total mass of the solder paste.

The hybrid bonding structure may have a Poisson's ratio in a range of about 0.31 to about 0.35.

The hybrid bonding structure may have a coefficient of thermal expansion in a range of about 14 μm/(m·K) to about 40 μm/(m·K).

The ceramic particles may include one or more surfaces having etched irregularities thereof.

The ceramic particles may each include a metal thin film configured to form an intermetallic compound on one or more surfaces of the ceramic particles.

The metal thin film may include at least one of Au, Ag, Sn, In, Cu, or Ni.

The solder ball may include at least one of Sn—Ag—Cu alloy, Sn—Bi alloy, Sn—Bi—Ag alloy, or Sn—Ag—Cu—Ni alloy.

An electronic device may include the semiconductor device.

According to some example embodiments, a hybrid bonding structure may include a solder ball; and a solder paste bonded to the solder ball. The solder paste may include solder particles, the solder particles including at least one of In, Zn, SnBiAg alloy, or SnBi alloy, a flux, and ceramic particles. The ceramic particles may include at least one of $La_2O_3$, $CeO_2$, SiC, $ZrO_2$, $TiO_2$, $Y_2O_3$, or AlN.

The ceramic particles may include one or more surfaces having etched irregularities thereof.

The ceramic particles may each include a metal thin film configured to form an intermetallic compound on one or more surfaces of the ceramic particles.

The metal thin film may include at least one of Au, Ag, Sn, In, Cu, or Ni.

The solder ball may include at least one of Sn—Ag—Cu alloy, Sn—Bi alloy, Sn—Bi—Ag alloy, or Sn—Ag—Cu—Ni alloy.

According to some example embodiments, a method may include forming a metal pad on a semiconductor chip, placing a solder ball on the metal pad such that the solder ball is attached to the metal pad, applying a solder paste to a substrate based on using a mask, wherein the solder paste includes solder particles, the solder particles including at least one of In, Zn, SnBiAg alloy, or SnBi alloy, a flux, and ceramic particles, bringing the solder ball into contact with the solder paste, and at least partially melting the solder paste to cause the solder paste to become bonded to the solder ball to form a semiconductor device, such that a boundary area between the solder ball and the solder paste bonded thereto has a modulus of elasticity in a range of about 42.0 GPa to about 45.0 GPa.

The method may further include manufacturing an electronic device that includes the semiconductor device.

The ceramic particles may include at least one of $La_2O_3$, $CeO_2$, SiC, $ZrO_2$, $TiO_2$, $Y_2O_3$, or AlN.

The solder particles may include Sn(42.0 wt %)-Ag(0.4 wt %)-Bi(57.5−X) wt %, and the ceramic particles include $CeO_2(X)$ wt %, where $0.05 \leq X \leq 0.1$.

The ceramic particles may be included in an amount of about 0.05 wt % to about 0.1 wt % of a total mass of the solder paste.

The ceramic particles may include one or more surfaces having etched irregularities thereof.

The ceramic particles may each include a metal thin film configured to form an intermetallic compound on one or more surfaces of the ceramic particles.

The metal thin film may include at least one of Au, Ag, Sn, In, Cu, or Ni.

The solder ball may include at least one of Sn—Ag—Cu alloy, Sn—Bi alloy, Sn—Bi—Ag alloy, or Sn—Ag—Cu—Ni alloy.

According to some example embodiments, a solder paste composition may include solder particles, the solder particles including at least one of In, Zn, SnBiAg alloy, or SnBi alloy; and ceramic particles. The ceramic particles may include at least one of $La_2O_3$, $CeO_2$, SiC, $ZrO_2$, $TiO_2$, $Y_2O_3$, or AlN.

The ceramic particles may include one or more surfaces having etched irregularities thereof.

The ceramic particles may each include a metal thin film configured to form an intermetallic compound on one or more surfaces of the ceramic particles.

The metal thin film may include at least one of Au, Ag, Sn, In, Cu, or Ni.

The solder paste composition may further include a flux.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
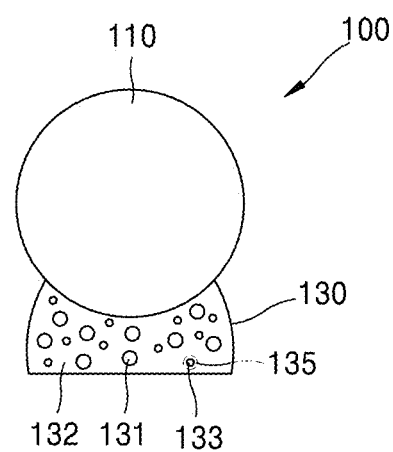
FIG. 1 is a schematic view of a hybrid bonding structure according to some example embodiments.

Reference will now be made in detail to example embodiments, some of which are illustrated in the accompanying drawings, wherein like reference numerals refer to like elements throughout. In this regard, some example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, hybrid bonding structures, solder paste compositions, semiconductor devices including the same and/or electronic devices including the same according to some example embodiments will be described in detail with the accompanying drawings. In the drawings, like reference numerals refer to like elements, and the size of each element may be exaggerated for clarity and convenience of explanation. It will be understood that, although the terms first, second, etc. may be used herein to describe various elements, these elements should not be limited by these terms. These terms are only used to distinguish one element from another.

As used herein, the singular forms "a," "an," and "the" may be intended to include the plural forms as well, unless the context clearly indicates otherwise. In addition, when an element is referred to as "comprising" or "including" a component, it does not preclude another component but may further include the other component unless the context clearly indicates otherwise. In addition, in the drawings, the size and thickness of each element may be exaggerated for clarity of explanation. It will be understood that when a certain material layer is referred to as being "on" a substrate or another layer, it can be directly on the substrate or the other layer, or an intervening third layer and/or space may be present such that the certain material layer may be indirectly on the substrate or the other layer so as to be isolated from direct contact with the substrate or the other layer. Also, materials included in layers described in some example embodiments below are only provided as examples, and other materials may be used.

The term "unit", "module" or the like means a unit configured to process at least one function or operation, and this may be implemented in hardware or software, or implemented by combining hardware and software.

The particular implementations shown and described herein are illustrative examples and are not intended to otherwise limit the scope of the present inventive concepts in any way. For the sake of brevity, conventional electronics, control systems, software development and other functional aspects of the systems may not be described in detail. Furthermore, the connecting lines, or connecting member shown in the various figures presented are intended to represent example functional relationships and/or physical or circuit connections between the various elements, and many alternative or additional functional relationships, physical connections or circuit connections may be present in a practical device.

The use of the terms "the" and similar referents in the context of describing the some example embodiments are to be construed to cover both the singular and the plural.

The steps of all methods described herein can be performed in any suitable order unless otherwise indicated herein or otherwise clearly contradicted by context. The use of any and all examples, or example language (e.g., "such as") provided herein, is intended merely to better illuminate the inventive concepts and does not pose a limitation on the scope of the inventive concepts unless otherwise claimed.

FIG. 1 is a schematic view of a hybrid bonding structure according to some example embodiments.

The hybrid bonding structure 100 includes a solder ball 110 and a solder paste 130 bonded (e.g., adhered, affixed, etc.) to the solder ball 110.

The solder ball 110 may include, for example, at least one alloy selected from the group consisting of Sn—Ag—Cu alloy, Sn—Bi alloy, Sn—Bi—Ag alloy, or Sn—Ag—Cu—Ni alloy. In some example embodiments, the solder ball 110 may include, at least one of Sn—Ag—Cu alloy, Sn—Bi alloy, Sn—Bi—Ag alloy, or Sn—Ag—Cu—Ni alloy. The solder ball 110 may include, for example, at least one of Sn—Ag(0.3~3)-Cu(0.1~1), Sn—Bi(35~75), Sn—Bi(35~75)-Ag(0.1~20), or Sn—Ag(0.5~5)-Cu(0.1~2)-Ni (0.05~0.1). For example, when the solder ball 110 is composed of a Sn—Ag—Cu alloy, the solder ball 110 may include SAC305 (Sn-3.0Ag-0.5Cu), SAC205 (Sn-2.0Ag-0.5Cu), or the like.

The solder paste 130 may include solder particles 131, flux 132, and ceramic particles 133. The solder particles 131 may be the main component, and the flux 132 and the ceramic particles 133 may be auxiliary components. In some example embodiments, the flux 132 may be omitted. In some example embodiments, some or all of the solder paste 130, including the solder particles 131 according to any of the example embodiments and ceramic particles 133 according to any of the example embodiments, and including or excluding the flux 132 according to any of the example embodiments, may be referred to herein as a solder paste composition. It will be understood that all descriptions of the solder paste 130, including at least the solder particles 131 and ceramic particles 133, according to any of the example embodiments may apply to a solder paste composition that includes at least the solder particles 131 and ceramic particles 133 and may comprise, with or without the flux 132, the solder paste 130.

The solder particles 131 may include, for example, at least one of In, Zn, SnBiAg alloy, or SnBi alloy. The solder particles 131 may include, for example, Sn58Bi. The solder particles 131 may have diameters in the range of, for example, about 20 μm to about 45 μm.

The flux 132 may include, for example, a water-soluble flux or a fat-soluble flux. The flux 132 may include at least one selected from the group consisting of a rosin-based flux, a resin-based flux, and an organic acid-based flux. However, the flux is not limited thereto.

The ceramic particles 133 may have a content in the range of, for example, about 0.05 wt % to about 0.1 wt %. Restated, the ceramic particles 133 may be included in the solder past in an amount of about 0.05 wt % to about 0.1 wt % as a proportion of a total mass or weight of the solder paste. The terms "wt %" and "w %" may be used interchangeably and may refer to a weight percent as a proportion of a total mass or weight of the solder paste. The ceramic particles 133 may include, for example, at least one of $La_2O_3$, $CeO_2$, SiC, $ZrO_2$, $TiO_2$, $Y_2O_3$, or AlN. For example, the solder particles 131 may include Sn57.5Bi0.4Ag and the ceramic particles 133 may include 0.1 $CeO_2$. For example, the solder particles 131 may include Sn(42.0 w %)-Bi(57.5 w %)-Ag(0.4 w %), and the ceramic particles 133 may include $CeO_2$ (0.1 w %). This is only an example, and various composition ratios are possible. For example, the solder particles 131 may include Sn(42.0 w %)-Ag(0.4 w %)-Bi(57.5−X) w %, and the ceramic particles 133 may include $CeO_2$ (0.05≤X≤0.1) w %. Restated, the solder particles 131 may include Sn(42.0 w %)-Ag(0.4 w %)-Bi(57.5−X) w %, and the ceramic particles 133 may include $CeO_2(X)$ w %, where 0.05≤X≤0.1. The ceramic particles 133 may be surface-treated, such that the ceramic particles 133 have one or more surfaces having surface irregularities therein (e.g., trenches extending from an outer surface of a ceramic particle 133 into an interior of the ceramic particle 133, such that the surface of the ceramic particle 133 has increased irregularity or roughness). Surface treatment may be done, for example, by etching or thin film coating. For example, the ceramic particles 133 may be surface treated via a plasma surface etching method. Based on having fine irregularities on the surfaces of ceramic particles 133 through plasma treatment, flowability in the solder paste may be suppressed.

The ceramic particles 133 may each include a metal thin film 135 configured to form an intermetallic compound on one or more surfaces of the ceramic particles. The metal thin film may include at least one of Au, Ag, Sn, In, Cu, or Ni.

The hybrid bonding structure 100 may electrically connect a semiconductor chip to a printed circuit board.

Figure 2:
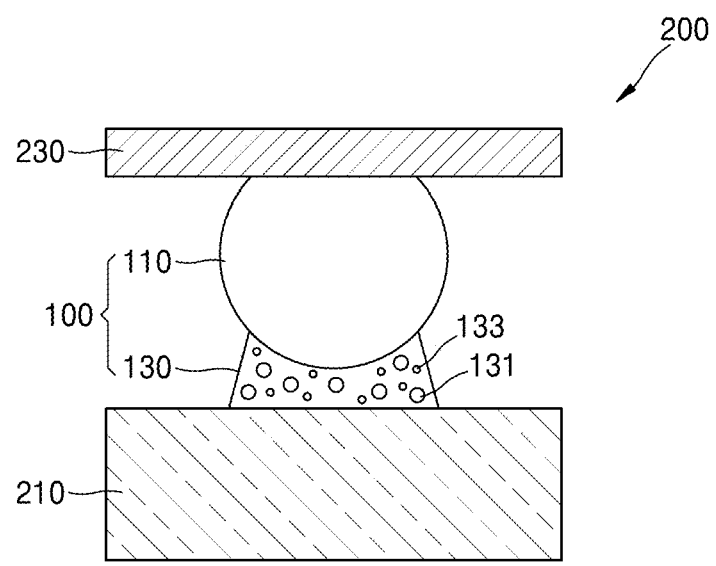
FIG. 2 is a schematic view of a semiconductor device including a hybrid bonding structure according to some example embodiments.

FIG. 2 is a schematic view of a semiconductor device 200 according to some example embodiments. The semiconductor device 200 may include a printed circuit board 210, a semiconductor chip 230, and a hybrid bonding structure 100 that couples the printed circuit board 210 to the semiconductor chip 230. The hybrid bonding structure 100 may be a hybrid bonding structure according to any of the example embodiments, for example including a solder ball and a solder paste bonded to the solder ball.

The hybrid bonding structure 100 may be configured to have a modulus of elasticity in the range of about 42.0 GPa to about 45.0 GPa. A boundary area A between a solder ball 110 and a solder paste 130 may have a modulus of elasticity in the range of about 42.0 GPa to about 45.0 GPa.

Figure 3:
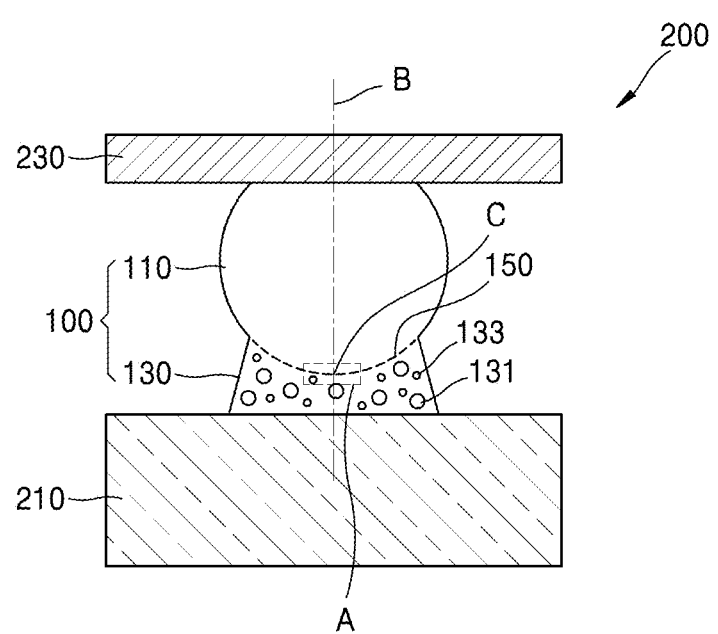
FIG. 3 is a view illustrating a boundary area of a hybrid bonding structure according to some example embodiments.

FIG. 3 is a view illustrating a boundary area of a hybrid bonding structure according to some example embodiments. Referring to FIG. 3, the boundary area A may represent an area including, for example, a bonding boundary line 150 at cross-sections of the solder ball 110 and the solder paste 130. The cross-sections represent cross-sections of the solder ball 110 and the solder paste 130 cut in a vertical direction. For example, when a point C, at which a line B crossing the center of the solder ball 110 in the vertical direction and the bonding boundary line 150 intersect with each other, is referred to as a boundary reference point, the boundary area A may represent a rectangular area within a range of about 5 μm in each of an upward direction and a downward direction and about 25 μm in each of a left direction and a right direction based on the boundary reference point. However, the boundary area A is not limited thereto and may be defined as various areas including a boundary line between the solder ball 110 and the solder paste 130.

The hybrid bonding structure 100 may be configured to have, for example, a Poisson's ratio in the range of about 0.31 to about 0.35 in the boundary area A. The Poisson's ratio may represent a strain rate when an external force is applied to the hybrid bonding structure 100.

The hybrid bonding structure 100 may be configured to have, for example, a coefficient of thermal expansion (CTE) in the range of about 14 μm/(m·K) to about 40 μm/(m·K) in the boundary area A.

When the difference in physical properties between the solder ball 110 and the solder paste 130 is large, a bonding force at the boundary area A between the solder ball 110 and the solder paste 130 may be weak and the hybrid bonding structure 100 may be easily broken by external impact. The hybrid bonding structure 100 according to some example embodiments may increase bonding force and decrease brittleness by adjusting at least one of a modulus of elasticity, a Poisson's ratio, or a CTE of each of the solder ball 110 and the solder paste 130.

The hybrid bonding structure 100 may be used as a low-temperature bonding material applied to (e.g., included in), for example, a data server, a notebook computer, a mobile phone, and a TV. As a substrate becomes thinner and a semiconductor device becomes smaller, the semiconductor device may be affected by temperature. Accordingly, a structure capable of being bonded (e.g., configured to be bonded) to a semiconductor device at a low temperature to have a reduced effect on the semiconductor device or to affect the semiconductor device as little as possible may be employed as a bonding structure for bonding of the semiconductor device. By the way, for example, Sn58Bi is a low-temperature bonding material, but has problems such as brittle fracture and thermal deformation.

For example, in the case of bonding using an SAC solder ball and a Sn58Bi solder paste, fracture occurs mainly at the boundary between the SAC solder ball and the Sn58Bi solder paste during tests such as dropping or thermal shock. The reason is that physical properties such as CTE, modulus of elasticity, and Poisson's ratio are significantly different between the SAC solder ball and the Sn58Bi solder paste and the Sn58Bi solder paste has brittleness.

In some example embodiments, the hybrid bonding structure 100 according to some example embodiments may be bonded at a low temperature and may reduce a defect rate by adjusting at least one of a modulus of elasticity, a Poisson's ratio, or a CTE and have strong brittleness properties.

The solder paste 130 may include, for example, a material having a melting point of about 200° C. or less. The solder paste 130 may include, for example, a material having a melting point of about 150° C. or less (e.g., about 130° C. to about 150° C.). In addition, the solder paste 130 may include ceramic particles 133 to alleviate brittleness, and the content of the ceramic particles 133 may be adjusted.

Figure 4:
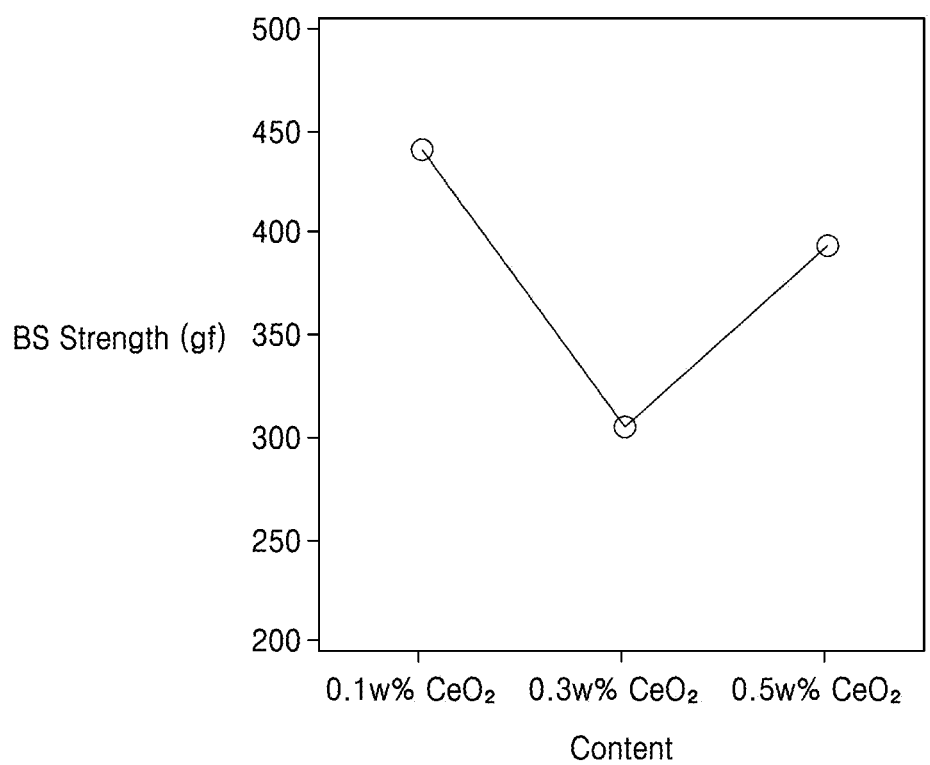
FIG. 4 illustrates a ball shear test (BST) strength according to the content of $CeO_2$ ceramic particles of a hybrid bonding structure according to some example embodiments.

FIG. 4 illustrates a ball shear (BS) strength according to the content of $CeO_2$ ceramic particles. For example, FIG. 4 illustrates a BS strength according to a content X of $CeO_2$ ceramic particles added to Sn(57.5−X)Bi0.4Ag solder particles. The BS strength may represent shear stress strength. When the content X of the $CeO_2$ ceramic particles is about 0.1 wt %, a relatively high shear stress strength is shown. When the content X of the $CeO_2$ ceramic particles is about 0.3 wt %, the shear stress strength decreases, and when the content X of the $CeO_2$ ceramic particles is about 0.5 wt %, the shear stress strength increases again. For example, when the content X of the $CeO_2$ ceramic particles is about 0.1 wt %, a BS strength of approximately 440 gf may be obtained. In the hybrid bonding structure 100 according to some example embodiments, the ceramic particles 133 may have a content greater than 0 and less than or equal to about 0.1 wt %. In some example embodiments, the ceramic particles 133 may have a content in the range of about 0.05 wt % to about 0.1 wt %. Therefore, the BS strength may be increased.

Figure 5:
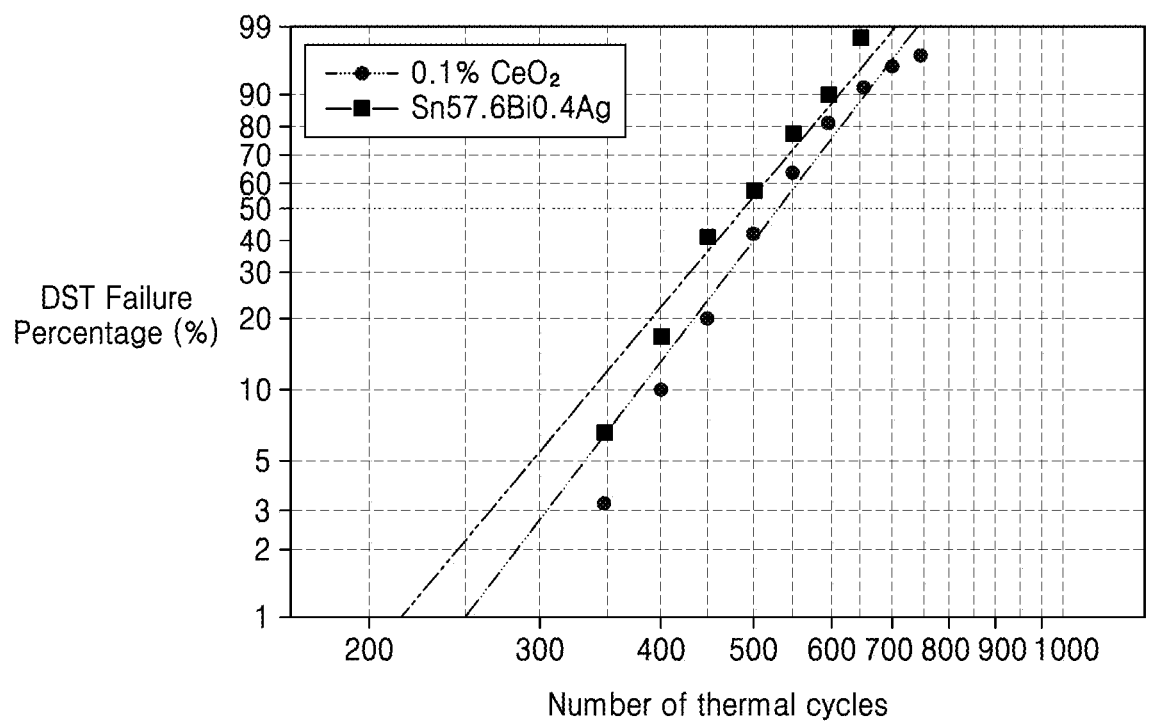
FIG. 5 is a graph showing a drop shock test (DST) failure percentage of a bonding structure according to the number of thermal cycles.

FIG. 5 is a graph showing a drop shock test (DST) failure percentage according to the number of thermal cycles. The graph of FIG. 5 shows results of performing thermal cycle (T/C) evaluation to confirm the thermal shock reliability of a semiconductor package. The T/C evaluation is an operation of performing a drop shock test on a semiconductor package while repeatedly changing the temperature from low to high. A mechanical strength may be evaluated through the drop shock test. For reference, in the T/C evaluation, a temperature range was about −40° C. to about 125° C. A comparative example shows a case where the solder paste includes Sn57.6Bi0.4Ag.

The failure percentage increases as the number of thermal cycles increases. According to some example embodiments, a hybrid bonding structure including 0.1 wt % of $CeO_2$ (e.g., wherein the solder paste includes solder particles including Sn(42.0 wt %)-Ag(0.4 wt %)-Bi(57.5−X) wt %, and the ceramic particles include $CeO_2$(X) wt %, where X=0.1) has a lower failure rate at the same number of cycles compared to the comparative example (e.g., wherein the solder paste includes Sn(57.6)Bi0.4Ag solder particles). The mechanical strength of the hybrid bonding structure according to some example embodiments is relatively high.

Figure 6:
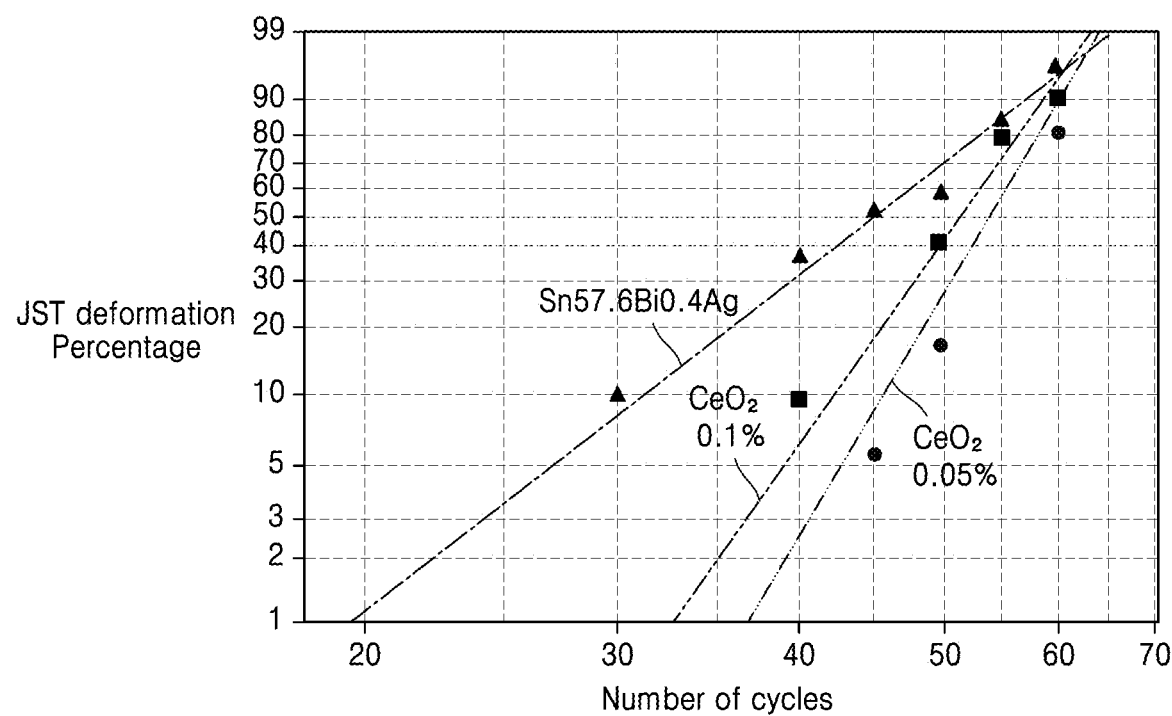
FIG. 6 is a graph showing a joint shift test (JST) strain rate according to the number of thermal cycles.

FIG. 6 is a graph showing results of a joint shift test (JST) for a hybrid bonding structure. FIG. 6 illustrates a JST strain rate according to the number of thermal cycles. In this case, a glass chip for evaluation was prepared, and the strain (i.e., deformation) of a joint (i.e., a bonding portion) during T/C evaluation was observed.

A comparative example shows a case where the solder paste includes Sn57.6Bi0.4Ag. In addition, a result of a JST when about 0.1 wt % of $CeO_2$ is included (e.g., wherein the solder paste of the hybrid bonding structure includes solder particles including Sn(42.0 wt %)-Ag(0.4 wt %)-Bi(57.5−X) wt %, and the ceramic particles include $CeO_2$(X) wt %, where X=0.1), and a result of a JST when about 0.05 wt % of $CeO_2$ are included (e.g., wherein the solder paste of the hybrid bonding structure includes solder particles including Sn(42.0 wt %)-Ag(0.4 wt %)-Bi(57.5−X) wt %, and the ceramic particles include $CeO_2$(X) wt %, where X=0.05) are shown. Compared to the comparative example, the case where ceramic particles are included, according to some example embodiments, has a relatively small strain rate. In addition, the case where about 0.05 wt % of $CeO_2$ is included has less strain than the case where about 0.1 wt % of $CeO_2$ is included.

The table below shows the number (e.g., quantity) of bonding portions in which strain (i.e., deformation) has occurred according to the number of thermal cycles.

TABLE 1

| Number of cycles | Comparative example (Sn57.6Bi0.4Ag) | $CeO_2$ 0.1 wt % | $CeO_2$ 0.05 wt % |
|---|---|---|---|
| 10 | 0 | 0 | 0 |
| 20 | 0 | 0 | 0 |
| 30 | 5 | 0 | 0 |
| 40 | 13 | 4 | 0 |
| 45 | 8 | 0 | 2 |
| 50 | 3 | 13 | 4 |
| 55 | 13 | 16 | 22 |
| 60 | 6 | 5 | 1 |
| 65 | 2 | 4 | 7 |

The hybrid bonding structure according to some example embodiments may be bonded at a low-temperature and reduce a defect rate of a bonding portion caused by thermal deformation. In addition, compared to a Sn58Bi-based solder of the comparative example, the hybrid bonding structure according to some example embodiments may improve mechanical properties, for example, toughness.

In the hybrid bonding structure according to some example embodiments, when the solder paste includes ceramic particles having a content in the range of about 0.05 wt % to about 0.1 wt %, a defect rate due to the wettability and poor application of the solder paste may be reduced.

In order to uniformly disperse the ceramic particles in the solder paste and improve wettability, the ceramic particles may be surface-treated, such that the ceramic particles have one or more surfaces having surface irregularities therein (e.g., trenches extending from an outer surface of a ceramic particle into an interior of the ceramic particle, such that the surface of the ceramic particle has increased irregularity). Surface treatment may be done, for example, by etching or thin film coating.

For example, for surface treatment of ceramic particles, a plasma surface etching method may be used. By forming fine irregularities on the surfaces of ceramic particles through plasma treatment, flowability in the solder paste may be suppressed. In some example embodiments, when a thin film coating is applied to ceramic particles, a metal thin film, which is capable of forming an intermetallic compound on the surfaces (e.g., one or more surfaces) of the ceramic particles during a process of bonding solder particles to the surfaces of the ceramic particles, may be formed. Restated, the ceramic particles may each include a metal thin film configured to form an intermetallic compound on one or more surfaces of the ceramic particles. The intermetallic compound represents a compound composed of two or more metals. A common alloy has a structure of a solid solution in which a structure of one metal is maintained and the other metal is randomly substituted. The common alloy is referred to as a solid solution alloy. Even though metals constituting the solid solution alloy are the same, the composition of the solid solution alloy may be made in various ratios, although there is a certain width. The intermetallic compound is a compound having a crystal structure different from that of the original metal. The composition of the intermetallic compound may include two or more metals with a simple integer ratio. The metal thin film may include, for example, at least one of Au, Ag, Sn, In, Cu, or Ni.

In the hybrid bonding structure according to some example embodiments, ceramic particles may be uniformly dispersed in the solder paste. During the bonding process, mechanical properties may be improved by maintaining a dispersed state of the ceramic particles in the solder paste.

Figure 12:
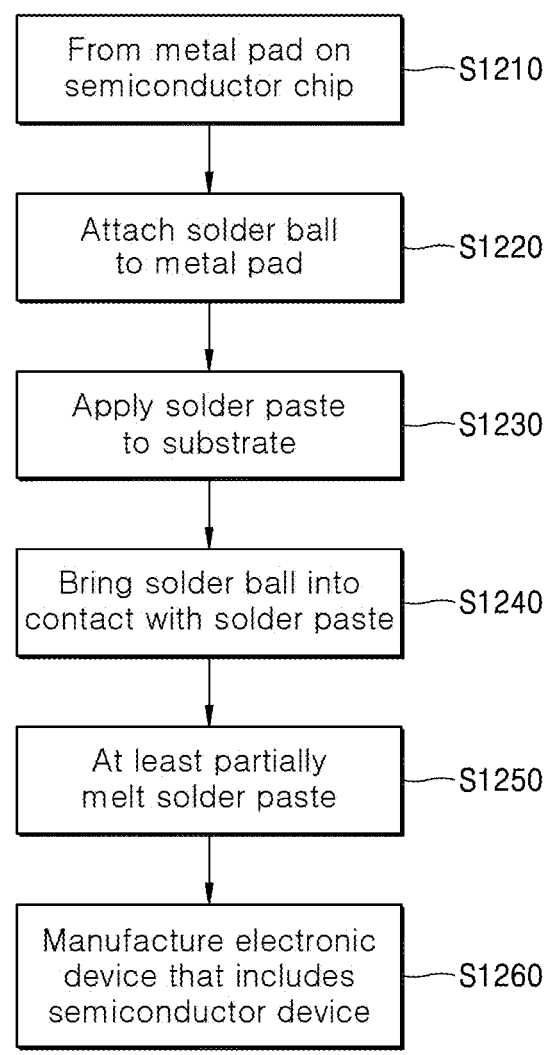
FIG. 12 is a flowchart illustrating a method of manufacturing a semiconductor device, according to some example embodiments.

FIGS. 7, 8, 9, 10, and 11 are views illustrating a method of manufacturing a semiconductor device, according to some example embodiments. FIG. 12 is a flowchart illustrating a method of manufacturing a semiconductor device, according to some example embodiments.

Figure 7:
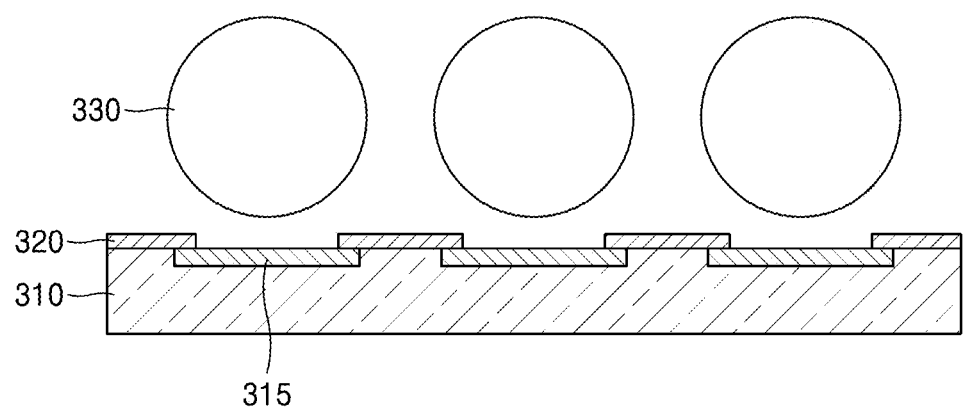
FIGS. 7, 8, 9, 10, and 11 are views illustrating a method of manufacturing a hybrid bonding structure, according to some example embodiments.

Referring to FIG. 7 and FIG. 12, at S1210 a metal pad 315 may be formed on a semiconductor chip 310 and a solder ball 330 may be arranged (e.g., placed) on the metal pad 315, for example to directly contact the metal pad. The semiconductor chip 310 may include, for example, a memory chip. The semiconductor chip 310 may include, for example, DRAM or PRAM. Reference numeral 320 denotes a protective film.

Figure 8:
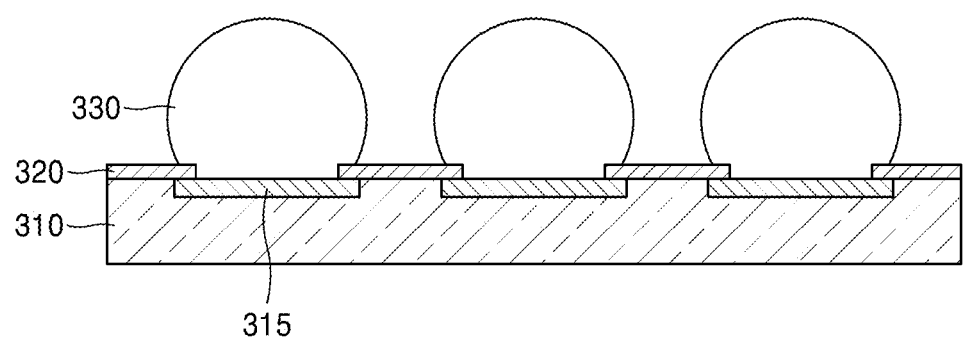

Referring to FIG. 8 and FIG. 12, at S1220 the solder ball 330 may be attached to (and may direct contact) the metal pad 315. The solder ball 330 may include any of the solder balls according to any of the example embodiments. The solder ball 330 may include, for example, at least one alloy selected from the group consisting of Sn—Ag—Cu alloy, Sn—Bi alloy, Sn—Bi—Ag alloy, and Sn—Ag—Cu—Ni alloy. In some example embodiments, the solder ball 330 may include, at least one of Sn—Ag—Cu alloy, Sn—Bi alloy, Sn—Bi—Ag alloy, or Sn—Ag—Cu—Ni alloy.

Figure 9:
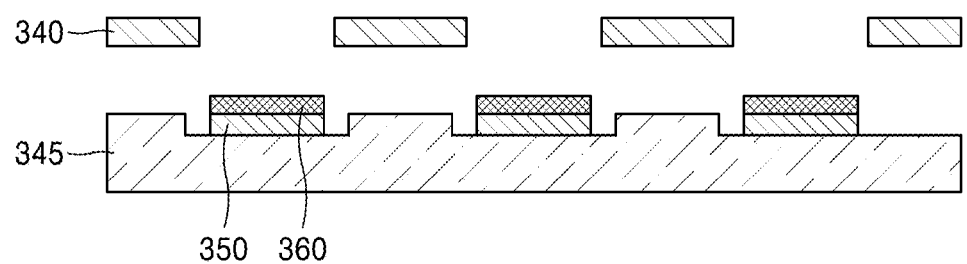

Referring to FIG. 9 and FIG. 12, at S1230 a solder paste 360 may be applied to a substrate, including for example a printed circuit board 345 but not limited thereto, based on using a mask 340, for example such that one or more discrete instances of solder paste are on one or more limited portions of a surface of the substrate (e.g., printed circuit board 345) and one or more remainder portions of said surface of the substrate are exposed from the solder paste 360, for example as shown in FIG. 9. As shown in FIG. 9, when multiple instances of solder paste 360 are applied to the substrate (e.g., printed circuit board 345), the multiple instances of solder paste 360 are isolated from direct contact with each other, based on the solder paste 360 being applied to the substrate based on using the mask 340. The solder paste 360 may include any of the solder pastes according to any of the example embodiments. As a method of applying the solder paste 360, for example, a stencil printing method may be used. The printed circuit board 345 may include an electrode 350 in addition to a wire required to supply power or a thin-film-transistor (TFT). The electrode 350 may be formed using a portion of a metal wire formed on the printed circuit board 345, or may be formed as a metal pad connected to the metal wire. Since the solder paste 360 is substantially the same as that described with reference to FIG. 1, a detailed description thereof is omitted here.

An example of a process of manufacturing the solder paste 360 will be described below. A solder paste manufacturing method may include preparing a solder solution by putting solder particles in an organic solvent. After a mixed solution is prepared by putting ceramic particles in the solder solution, the ceramic particles may be dispersed using, for example, ultrasonic waves. Then, the mixed solution is put into a ball mill equipment, and a rotating drum is rotated at high speed. The mixed solution in which the ceramic particles are dispersed is retrieved and dried. Then, a solder paste may be prepared by mixing a flux with the solder particles and the ceramic particles. The flux may prevent oxidation of the solder particles. The flux may include a material having good thermal decomposition so that it is capable of being decomposed during a low-temperature bonding process.

The flux may include a water-soluble flux or a fat-soluble flux. The flux may include at least one selected from the group consisting of a rosin-based flux, a resin-based flux, and an organic acid-based flux. However, the flux is not limited thereto. In some example embodiments, the flux may include at least one of a rosin-based flux, a resin-based flux, or an organic acid-based flux.

In some example embodiments, based on adding ceramic particles to the solder paste, the crystal grains of the solder particles may be refined, and the growth of the intermetallic compound may be suppressed, thereby improving mechanical properties.

Figure 10:
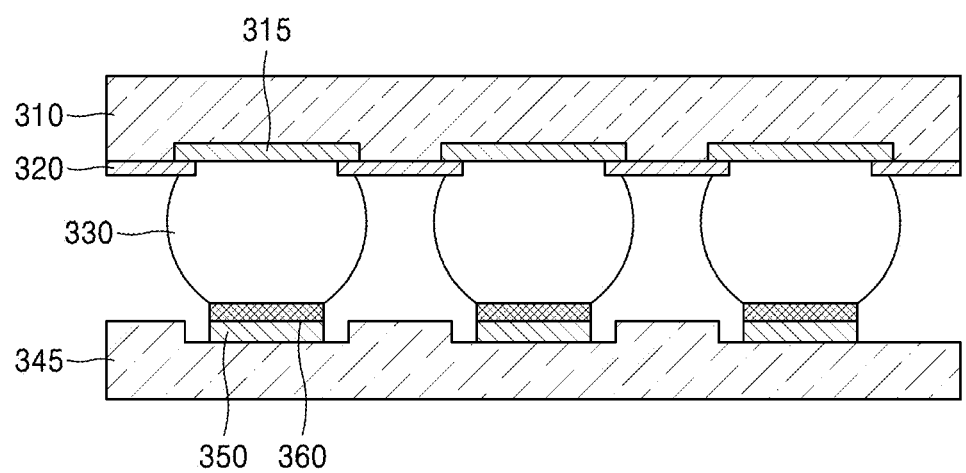
Figure 11:
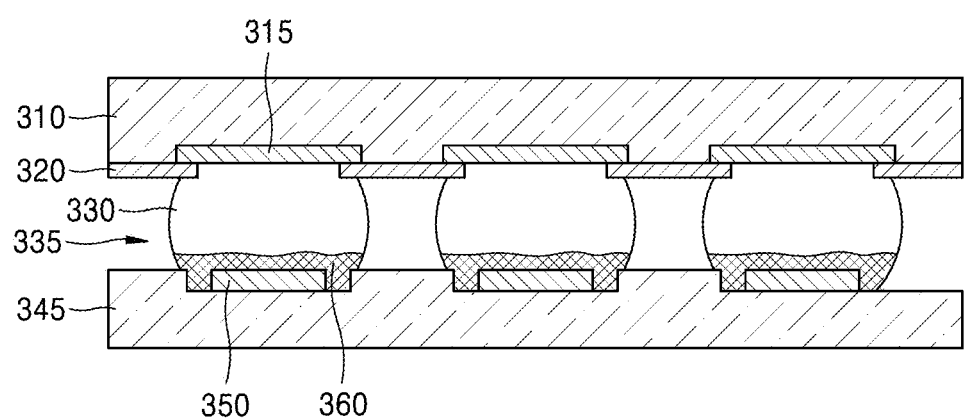

Referring to FIG. 10 and FIG. 12, at S1240 the solder ball 330 of FIG. 8 may be brought into contact with the solder paste 360. In addition, referring to FIG. 11 and FIG. 12, at S1250 the solder paste 360 may be at least partially melted through a reflow process to be bonded to the solder ball 330 to form the hybrid bonding structure 335 that bonds the semiconductor chip 310 to the circuit board 345 at S1250, thereby forming a semiconductor device according to some example embodiments, thereby forming a semiconductor device (which may be the semiconductor device according to any of the example embodiments), such that a boundary area between the solder ball and the solder paste bonded thereto has a modulus of elasticity in a range of about 42.0 GPa to about 45.0 GPa. The melting temperature of the solder paste 360 may be, for example, 150° C. or less. The melting temperature of the solder paste 360 may have, for example, a range of about 130° C. to about 150° C.

The hybrid bonding structure may be hardened during a cooling period in the reflow process.

A semiconductor device according to some example embodiments may include an active device or a passive device. The semiconductor device may be highly integrated on one substrate. In this case, a low-temperature bonding material is required to reduce defects and performance degradation due to thermal damage to the semiconductor device. The low-temperature bonding material may be applied to a semiconductor device according to some example embodiments. For example, the semiconductor device may include a memory semiconductor package or module used in a data server and a mobile notebook.

In some example embodiments, the semiconductor device according to some example embodiments may be applied to a flexible display, a wearable display, a foldable display, a stretchable display, and the like.

Figure 13:
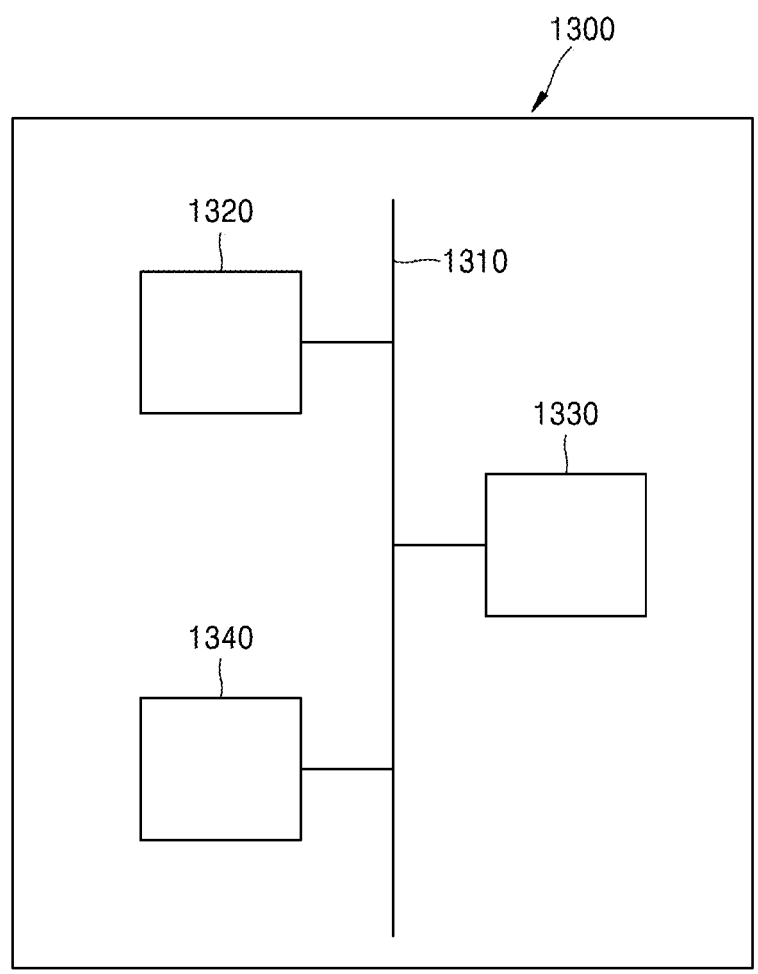
FIG. 13 is a schematic diagram of an electronic device according to some example embodiments.

FIG. 13 is a schematic diagram of an electronic device according to some example embodiments.

Referring to FIG. 13, the electronic device 1300 may include a processor 1320, a memory 1330, and a display device 1340 which are electrically connected to each other through a bus 1310. The processor 1320, the memory 1330, and/or the display device 1340 may include any one of the semiconductor devices according to any of the example embodiments herein. In some example embodiments the display device 1340 may be a flexible display, a wearable display, a foldable display, a stretchable display, and the like according to any of the example embodiments. The memory 1330, which is a non-transitory computer-readable medium, may store an instruction program. The processor 1320 may execute a stored instruction program to perform one or more functions. The processor 1320 may generate output (e.g., an image to be displayed on the display device 1340) based on such processing.

The memory 1330 may be a non-transitory computer readable medium and may store a program of instructions. The memory 1330 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1320 may execute the stored program of instructions to perform one or more functions. The processor 1320 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1320 may be configured to generate an output (e.g., an electrical signal) based on such processing.

Referring to FIG. 12 and FIG. 13, at S1260 an electronic device 1300 that includes the semiconductor device formed at S1250 may manufactured. For example, the semiconductor device may be incorporated (e.g., applied) into one or more elements of the electronic device 1300 to complete manufacturing of the electronic device 1300. Said one or more elements may include, for example, a display device 1340, a memory 1330, or a processor 1320. Said incorporation may include, as part of the manufacturing of the electronic device 1300, adhesion of the semiconductor device to one or more other components of the one or more elements via an adhesive, soldering of electrical connections between the semiconductor device and one or more other components of the one or more elements, or the like, in order to at least partially complete assembly of said one or more elements and/or assembly of said electronic device 1300.

The above-described example embodiments are merely examples, and various modifications and equivalent other example embodiments may be made from the above-described example embodiments by those of ordinary skill in the art. Therefore, a true technical protection scope according to some example embodiments has to be determined by the inventive concepts described in the following claims.

Some example embodiments provide a hybrid bonding structure capable of bonding at a low temperature. By bonding a printed circuit board to a semiconductor chip at a low temperature by using a solder paste including ceramic particles, the deformation of a semiconductor package due to a high temperature may be reduced. In addition, the hybrid bonding structure according to some example embodiments may improve brittleness (e.g., reduce brittleness), thereby reducing package defects of a semiconductor device.

It should be understood that example embodiments described herein should be considered in a descriptive sense only and not for purposes of limitation. Descriptions of features or aspects within each example embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims.

What is claimed is:

1. A hybrid bonding structure, comprising:
a solder ball; and
a solder paste bonded to the solder ball,
wherein the solder paste includes
   solder particles, the solder particles including at least one of In, Zn, SnBiAg alloy, or SnBi alloy,
   a flux, and
   ceramic particles,
wherein a boundary area between the solder ball and the solder paste has a modulus of elasticity in a range of about 42.0 GPa to about 45.0 GPa, and
wherein the solder particles include Sn(42.0 wt %)-Ag (0.4 wt %)-Bi(57.5−X) wt %, and the ceramic particles include $CeO_2$(X) wt %, where $0.05 \leq X \leq 0.1$.

2. The hybrid bonding structure of claim 1, wherein the ceramic particles include at least one of $La_2O_3$, $CeO_2$, SiC, $ZrO_2$, $TiO_2$, $Y_2O_3$, or AlN.

3. The hybrid bonding structure of claim 1, wherein the ceramic particles are included in an amount of about 0.05 wt % to about 0.1 wt % of a total mass of the solder paste.

4. The hybrid bonding structure of claim 1, wherein the hybrid bonding structure has a Poisson's ratio in a range of about 0.31 to about 0.35.

5. The hybrid bonding structure of claim 1, wherein the hybrid bonding structure has a coefficient of thermal expansion in a range of about 14 μm/(m·K) to about 40 μm/(m·K).

6. The hybrid bonding structure of claim 1, wherein the ceramic particles include one or more surfaces having etched irregularities thereof.

7. The hybrid bonding structure of claim 1, wherein the ceramic particles each include a metal thin film configured to form an intermetallic compound on one or more surfaces of the ceramic particles.

8. The hybrid bonding structure of claim 7, wherein the metal thin film includes at least one of Au, Ag, Sn, In, Cu, or Ni.

9. The hybrid bonding structure of claim 1, wherein the solder ball includes at least one of Sn—Ag—Cu alloy, Sn—Bi alloy, Sn—Bi—Ag alloy, or Sn—Ag—Cu—Ni alloy.

10. A semiconductor device, comprising:
a printed circuit board;
a semiconductor chip; and
a hybrid bonding structure between the printed circuit board and the semiconductor chip,
wherein the hybrid bonding structure includes a solder ball and a solder paste bonded to the solder ball,
wherein the solder paste includes
   solder particles, the solder particles including at least one of In, Zn, SnBiAg alloy, or SnBi alloy,
   a flux, and
   ceramic particles,
wherein a boundary area between the solder ball and the solder paste has a modulus of elasticity in a range of about 42.0 GPa to about 45.0 GPa, and
wherein the solder particles include Sn(42.0 wt %)-Ag (0.4 wt %)-Bi(57.5−X) wt %, and the ceramic particles include $CeO_2$(X) wt %, where $0.05 \leq X \leq 0.1$.

11. The semiconductor device of claim 10, wherein the ceramic particles include at least one of $La_2O_3$, $CeO_2$, SiC, $ZrO_2$, $TiO_2$, $Y_2O_3$, or AlN.

12. The semiconductor device of claim 10, wherein the ceramic particles include about 0.05 wt % to about 0.1 wt % of a total mass of the solder paste.

13. The semiconductor device of claim 10, wherein the hybrid bonding structure has a Poisson's ratio in a range of about 0.31 to about 0.35.

14. The semiconductor device of claim 10, wherein the hybrid bonding structure has a coefficient of thermal expansion in a range of about 14 μm/(m·K) to about 40 μm/(m·K).

15. The semiconductor device of claim 10, wherein the ceramic particles include one or more surfaces having etched irregularities thereof.

16. The semiconductor device of claim 10, wherein the ceramic particles each include a metal thin film configured to form an intermetallic compound on one or more surfaces of the ceramic particles.

17. The semiconductor device of claim 16, wherein the metal thin film includes at least one of Au, Ag, Sn, In, Cu, or Ni.

18. The semiconductor device of claim 10, wherein the solder ball includes at least one of Sn—Ag—Cu alloy, Sn—Bi alloy, Sn—Bi—Ag alloy, or Sn—Ag—Cu—Ni alloy.

19. An electronic device comprising the semiconductor device of claim 10.

20. A hybrid bonding structure, comprising:
a solder ball; and
a solder paste bonded to the solder ball,
wherein the solder paste includes
   solder particles, the solder particles including at least one of In, Zn, SnBiAg alloy, or SnBi alloy,
   a flux, and
   ceramic particles, the ceramic particles including at least one of $La_2O_3$, $CeO_2$, SiC, $ZrO_2$, $TiO_2$, $Y_2O_3$, or AlN,
wherein the ceramic particles are included in an amount of about 0.05 wt % to about 0.1 wt % of a total mass of the solder paste.

* * * * *